(12) United States Patent
Kim et al.

(10) Patent No.: US 10,471,839 B2
(45) Date of Patent: Nov. 12, 2019

(54) METHOD AND SYSTEM FOR DETECTING FUSION OF RELAY

(71) Applicant: Hyundai Motor Company, Seoul (KR)

(72) Inventors: Kyung Ho Kim, Gyeonggi-do (KR); Kyung In Min, Gyeonggi-do (KR); Jae Hoon Choi, Gyeonggi-Do (KR); Dong Gun Kim, Gyeonggi-Do (KR); Do Kyoung Lim, Gyeonggi-do (KR); Jin Wook Kim, Gyeonggi-Do (KR); Jun Ho Bang, Gyeonggi-do (KR); Yoon Jun Lee, Seoul (KR); Hee Tae Yang, Seoul (KR); Yu Seok Kim, Seoul (KR); Hyo Sik Moon, Gyeonggi-Do (KR); Kyun Young Ahn, Seoul (KR); Suk Hyung Kim, Gyeonggi-Do (KR); Dong Il Kim, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 464 days.

(21) Appl. No.: 15/228,121

(22) Filed: Aug. 4, 2016

(65) Prior Publication Data
US 2017/0106765 A1 Apr. 20, 2017

(30) Foreign Application Priority Data

Oct. 16, 2015 (KR) .................. 10-2015-0144986

(51) Int. Cl.
*B60L 11/18* (2006.01)
*B60W 20/50* (2016.01)
(Continued)

(52) U.S. Cl.
CPC ......... *B60L 11/1851* (2013.01); *B60L 3/0069* (2013.01); *B60L 3/04* (2013.01);
(Continued)

(58) Field of Classification Search
CPC ...... B60L 11/1851; B60L 3/04; B60L 3/0069; B60L 2250/01; B60L 2250/10; B60W 50/029; B60W 50/14; B60W 20/50; G01R 31/007; G01R 31/3278; H01H 47/002; H02J 7/0047; H02J 7/0036
See application file for complete search history.

(56) References Cited

U.S. PATENT DOCUMENTS

2006/0021098 A1* 1/2006 Tezuka ................ H01H 47/002
477/7

FOREIGN PATENT DOCUMENTS

KR    10-2006-0014029      2/2006
KR      10-1241168 B1      3/2013
(Continued)

*Primary Examiner* — Christian Chace
*Assistant Examiner* — Aaron C Smith
(74) *Attorney, Agent, or Firm* — Mintz Levin Cohn Ferris Glovsky and Popeo, P.C.; Peter F. Corless

(57) ABSTRACT

A method and system for detecting fusion of a relay are provided to more accurately diagnose fusion of a relay by adjusting relay OFF order when a vehicle engine is turned off using data regarding whether fusion of a relay was detected when the vehicle engine was turned on. The method includes detecting whether first and second relays have been fused when a vehicle engine was turned on and adjusting OFF order of the first and second relays when the vehicle engine is turned off based on whether the first and second relays have been fused.

18 Claims, 5 Drawing Sheets

(51) Int. Cl.
*B60W 50/14* (2012.01)
*G01R 31/00* (2006.01)
*G01R 31/327* (2006.01)
*B60W 50/029* (2012.01)
*H02J 7/00* (2006.01)
*B60L 3/00* (2019.01)
*B60L 3/04* (2006.01)
*B60L 58/10* (2019.01)

(52) U.S. Cl.
CPC ............ *B60L 58/10* (2019.02); *B60W 20/50* (2013.01); *B60W 50/029* (2013.01); *B60W 50/14* (2013.01); *G01R 31/007* (2013.01); *G01R 31/3278* (2013.01); *H02J 7/0036* (2013.01); *H02J 7/0047* (2013.01); *B60L 2250/10* (2013.01); *Y02T 10/705* (2013.01); *Y02T 10/7005* (2013.01)

(56) References Cited

FOREIGN PATENT DOCUMENTS

| | | | |
|---|---|---|---|
| KR | 10-2013-0126146 A | | 11/2013 |
| KR | 20130126146 A | * | 11/2013 |
| KR | 10-2014-0025627 A | | 3/2014 |
| KR | 10-1470254 B1 | | 12/2014 |

* cited by examiner

METHOD AND SYSTEM FOR DETECTING FUSION OF RELAY

CROSS-REFERENCE TO RELATED APPLICATION

This application is based on and claims the benefit of priority to Korean Patent Application No. 10-2015-0144986, filed on Oct. 16, 2015, in the Korean Intellectual Property Office, the disclosure of which is incorporated herein in its entirety by reference.

TECHNICAL HELD

The present disclosure relates to a method and system for detecting fusion of a relay, and more particularly, to a technique of detecting fusion of a relay by controlling a relay operation when a vehicle engine is turned on or off.

BACKGROUND

Recently, eco-friendly vehicles have been developed using an electric motor as a driving source of a vehicle, and techniques of electric energy storage devices such as a battery as a power source of eco-friendly vehicles have also been rapidly developed. In addition, research and development has been conducted regarding internal/external vehicle devices and charging facilities for battery charging and expansion of a charging infrastructure, and the like.

As is known in the art, an eco-friendly vehicle such as an electric vehicle or a hybrid vehicle includes an electric motor as a vehicle power source, a motor control unit (MCU) (including an inverter) configured to drive an electric motor, a battery configured to supply power of an electric motor, and an in-vehicle charging device configured to charge a battery, and the like, and a charging port is also provided to connect a vehicle and an external charger.

The eco-friendly vehicle also includes a battery management system (BMS) configured to monitor a battery state and collect battery state information such as a voltage, a current, a temperature, a state of charge (SOC) of a battery pack, and provides the collected battery state information to other controllers within or extraneous to a vehicle. Thus, battery state information may be used in operating a vehicle or executing battery charging. A battery of an eco-friendly vehicle may be slowly charged by connecting alternating current (AC) power (a slow charger) to a vehicle or rapidly charged by connecting direct current (DC) power (a rapid charger) to a vehicle. When a slow charger supplies AC power to a vehicle, the AC power is converted into DC power by an on-board charger (OBC) to charge a battery in the vehicle.

Meanwhile, a rapid charger is a charger that converts AC power into DC power and supplies the converted DC power to a vehicle. Since the rapid charger is directly connected to a battery of a vehicle and provides a high current, the battery may be completely charged within a short period of time. To charge a battery, a connector of a charger (the aforementioned slow charger or rapid charger) is connected to a charging port of a vehicle, and charge power of the charger may be supplied to the vehicle when the connector is connected. The connector includes a plurality of terminals such as a communication terminal for communication connection to a vehicle, a communication power supply terminal, a ground connection terminal, and the like, as well as a power supply terminal configured to supply charge power.

Additionally, a power relay assembly (PRA) configured to selectively supply power and cut off power supply is provided in a power line of a vehicle. The PRA includes a plurality of relays which are devices for interrupting a high voltage of a high voltage battery and which are fastened when a vehicle engine is turned on and disconnected when the vehicle engine is turned off. However, fusion that both contacts are fixed frequently occurs in a relay, and thus, a method for detecting such fusion and a method for more easily detecting fusion when a vehicle engine is turned on or off are required.

SUMMARY

The present disclosure provides a method and system for detecting fusion of a relay, capable of more accurately diagnosing fusion of a relay by adjusting relay OFF order when a vehicle engine is turned off, using data regarding whether fusion of a relay was detected when the vehicle engine was turned on.

Technical subjects of the present disclosure are not limited to the foregoing technical subjects and any other technical subjects not mentioned will be understood from the following descriptions and become apparent by exemplary embodiments of the present disclosure. Also, it may be understood that the advantages, features and aspects of the present disclosure may be realized by means and combinations demonstrated in claims.

According to an exemplary embodiment of the present disclosure, a method for detecting fusion of a relay may include: detecting whether first and second relays have been fused when a vehicle engine was turned on; and adjusting off order of the first and second relays when the vehicle engine is turned off based on the detection of whether the first and second relays have been fused.

The method may further include: in response to detecting that the first and second relays have not been fused, simultaneously turning off both the first and second relays when the vehicle engine is turned off. Additionally, in response to detecting that the first and second relays have been fused, whether the second relay has been fused when the vehicle engine was turned on may be determined. When the second relay has been fused, the first relay may be turned off.

The method may further include: determining whether the first relay has been fused when the vehicle engine was turned off, after the turning off of the first relay; and when the first relay has been fused, determining that both the first relay and the second relay have been fused and providing a warning to a driver accordingly. When the first relay has not been fused in the determination of whether the first relay has been fused when the vehicle engine was turned off, the second relay may be determined to have been fused. Further, when the second relay has not been fused in the determination of whether the second relay has been fused when the vehicle engine was turned on, the second relay may be turned off.

The method may further include: determining whether the second relay has been fused when the vehicle engine was turned off, after the turning off of the second relay; and when the second relay has been fused, determining that both the first relay and the second relay have been fused and providing a warning to a driver accordingly. When the second relay has not been fused in the determination of whether the second relay has been fused when the vehicle engine was turned off, the first relay may be determined to have been fused.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
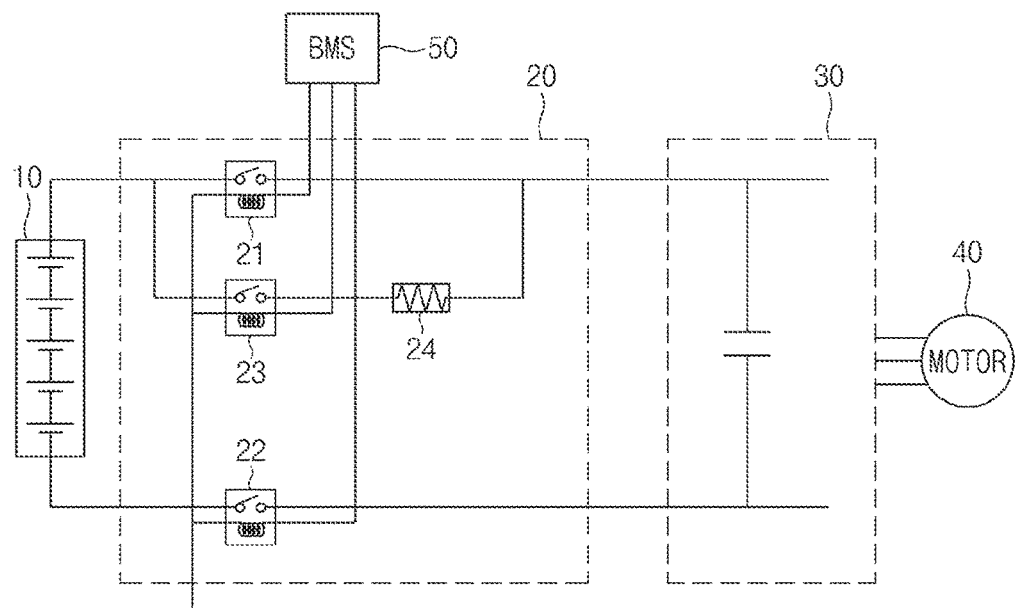
FIG. 1 is a view illustrating a configuration of a battery control system applied to an electric vehicle or a hybrid vehicle according to an exemplary embodiment of the present disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Advantages and features of the present disclosure, and implementation methods thereof will be described through exemplary embodiments described with reference to the accompanying drawings. The present disclosure may, however, be embodied in different forms and should not be construed as limited to the exemplary embodiments set forth herein. Rather, these embodiments are provided to describe the present disclosure so that a technical concept of the present disclosure may be easily practiced by those skilled in the art to which the present disclosure pertains.

In the drawings, the exemplary embodiments of the present disclosure are not limited to a specific form and are exaggerated for clarity. The specific terms used in the present disclosure are merely used to describe the present disclosure, and are not intended to limit the scope of the present disclosure described in claims. In the present disclosure, "connected/coupled" include a direct connection with other component or an indirect connection through other component.

Hereinafter, exemplary embodiment of the present disclosure will be described in detail with reference to the accompanying drawings.

FIG. 1 is a view illustrating a configuration of a battery control system applied to an electric vehicle or a hybrid vehicle according to an exemplary embodiment of the present disclosure. FIG. 1 is a view illustrating a configuration of a battery control system applied to an electric vehicle or a hybrid vehicle, in which a configuration and a connection state of a high voltage circuit unit (each component and a high voltage wire) including components such as a high voltage battery 10, a power relay assembly (PRA) 20, an inverter 30, and a driving motor 40 are schematically illustrated. The system may be operated by a controller.

Particularly, the battery control system as illustrated may include the high voltage battery 10, the driving motor 40 driven in response to receiving power from the high voltage battery 10, a motor control unit (MCU) including the inverter 30 configured to drive the driving motor 40, and the PRA 20 configured to execute switching to selectively supply battery power to a vehicle. In particular, a relay configured to interrupt a high voltage may be applied to the high voltage battery 10 for a vehicle, and safety of the battery may be ensured and the battery may be protected by turning on and off the relay.

The relay is generally referred to as the PRA 20, and the PRA 20 may include two relays (+) and (−) 21 and 22 as main power contacts, and a precharge relay 23 and a precharge resistor 24 installed in a circuit bypassing one of the two relays 21 and 22. Particularly, the relay (+) may be termed a first relay or a main relay (+), and the relay (−) may be termed a second relay or a main relay (−). In other words, the first relay 21 may be installed in a circuit between a positive (+) terminal of the high voltage battery 10 and a positive (+) terminal of a DC link, the second relay 22 may be installed in a circuit between a negative (−) terminal of the high voltage battery 10 and a negative (−) terminal of the DC link, and the precharge relay 23 and the precharge resistor 24 may be disposed in a bypass circuit bypassing the first relay 21.

The relays of the PRA 20 may be operated by the controller (e.g., MCU) to be turned on or off based on a relay control signal output from a battery management system (BMS) 50 or the MCU. In the present disclosure, when the BMS 50 detects a start ON input of the vehicle, whether the relays 21 and 22 are fused may be determined based on a voltage from the inverter 30 (DC link). In the start ON process of the vehicle, the relays may be operated in the following order the precharge relay 23 is turned on→the second relay 22 is turned on→the first relay 21 is turned on→the precharge relay 23 is turned off.

Figure 2:
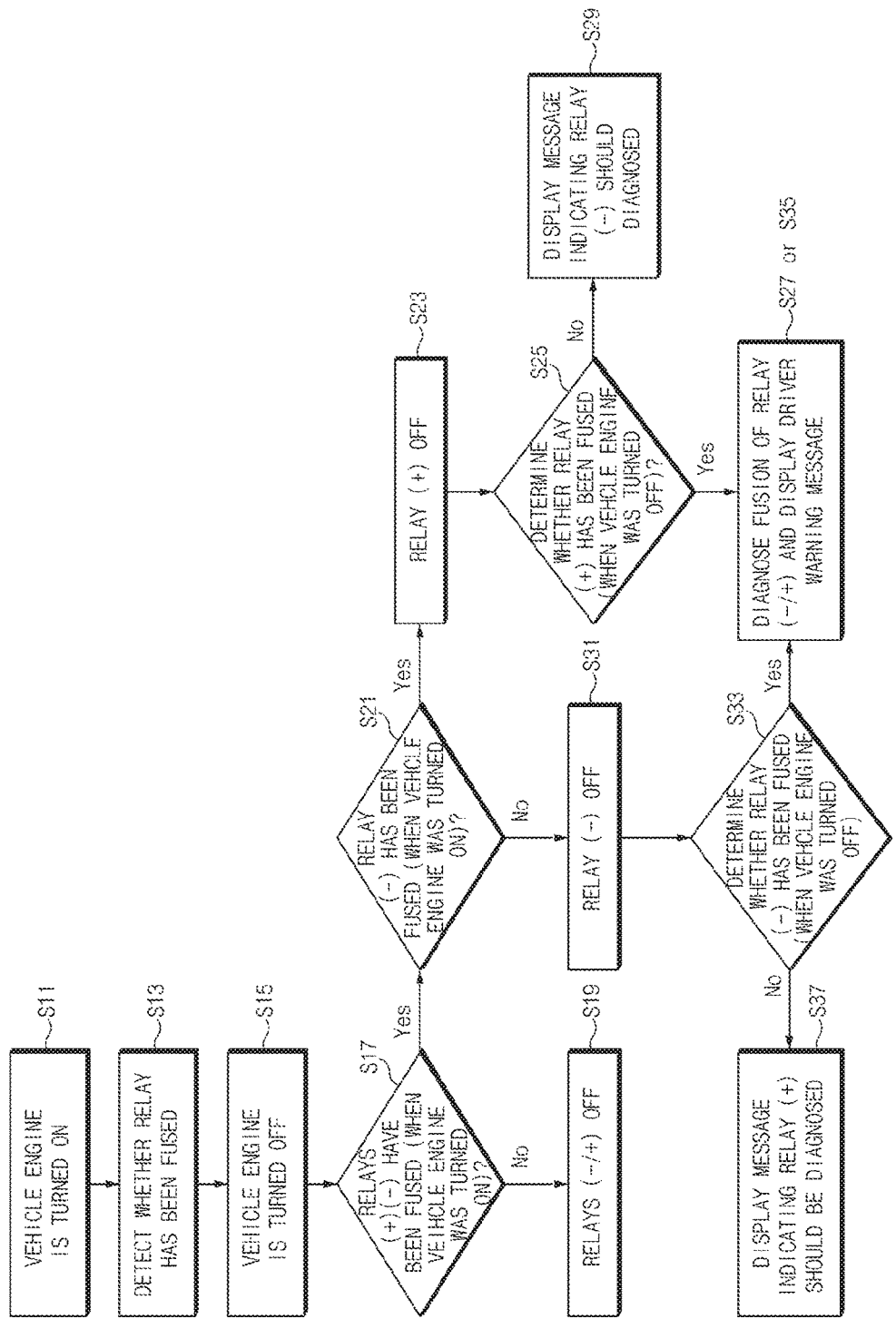
FIG. 2 is a flow chart illustrating a method for detecting fusion of a relay according to an exemplary embodiment of the present disclosure.

FIG. 2 is a flow chart illustrating a method for determining fusion of a relay according to an exemplary embodiment of the present disclosure. Referring to FIG. 2, when a vehicle engine of the vehicle including the high voltage battery for a vehicle is turned on, the BMS may be configured to determine whether relays disposed in the high voltage battery for a vehicle have been fused in operations S11 and S13.

In particular, the BMS may be configured to determine whether the first relay and the second relay have been fused using a start ON process and a start OFF process. The determination of whether the relays have been fused may include determining that none of the first and second relays have been fused, only the first relay has been fused, only the second relay has been fused, and both the first and second relays have been fused.

When the vehicle engine is turned off, the BMS may be configured to determine whether a relay has been fused when the vehicle engine was turned on in operations S15 and S17. In particular, when both the first relay and the second relay have not been fused when the vehicle engine was turned on, the BMS may be configured to simultaneously turn off the first relay and the second relay when the vehicle engine is turned off in operation S19. Thereafter, when at least one or more relays of the first and second relays have been fused when the vehicle engine was turned on, the BMS may be configured to determine whether the second relay has been fused when the vehicle engine was turned on in operation S21.

Thereafter, in response to determining that the second relay has been fused, the BMS may be configured to turn off the first relay in operation S23. Thereafter, when the first relay is not fused when the first relay is turned off, an inverter voltage may be decreased to 0V. However, when the first relay is fused due to a short circuit current which has occurred in a start ON sequence, the inverter voltage may be maintained to be equal to a voltage of the high voltage battery, whereby whether the first relay has been fused may be determined. Thereafter, when the vehicle engine is turned off, whether the first relay has been fused may be determined in operation S25.

Furthermore, when the first relay has been fused, fusion of the first and second relays may be determined and a warning message informing a driver regarding the fusion of the first and second relays may be displayed on cluster within the vehicle in operation S27. However, when the first relay has not been fused, a message indicating that fusion of the second relay should be determined may be displayed on the cluster within the vehicle in operation S29. Thereafter, in response to determining that the second relay has not been fused in operation S21, the second relay may be turned off by the BMS in operation S31.

When the vehicle engine is turned off, whether the second relay has been fused may be determined in operation S33. Thereafter, when the second relay has been fused, fusion of the first and second relays may be determined and a warning message informing the driver regarding the fusion may be displayed on the cluster within the vehicle in operation S35. However, when the second relay has not been fused, a message indicating that fusion of the first relay should be determined may be displayed on the cluster of the vehicle in operation S37.

Figure 3:
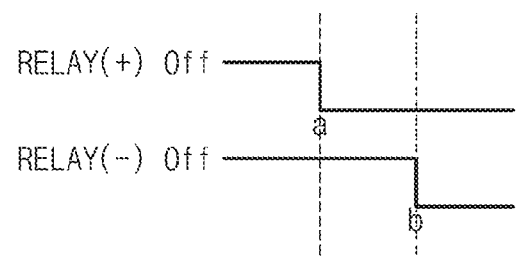
FIG. 3 is a view illustrating a process of turning off a vehicle engine to detect fusion of a relay according to an exemplary embodiment of the present disclosure.

FIG. 3 is a view illustrating a process of turning off a vehicle engine to detect fusion of a relay according to an exemplary embodiment of the present disclosure. Referring to FIG. 3, after the start ON process, the first relay may first be turned off and then the second relay may be turned off in a start OFF process. In particular, an inverter voltage in a section from a point in time (a) at which the first relay was turned off to a point in time (b) at which the second relay was turned off may be measured, and whether the first relay has been fused may be detected based on whether the inverter voltage has been changed.

Figure 4:
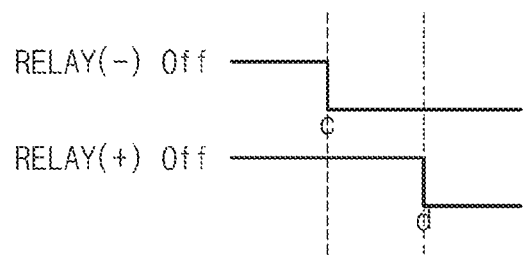
FIG. 4 is a view illustrating a process of turning off a vehicle engine to detect fusion of a relay according to another exemplary embodiment of the present disclosure.

Moreover, FIG. 4 is a view illustrating a process of turning off a vehicle engine to detect fusion of a relay according to another exemplary embodiment of the present disclosure. Referring to FIG. 4, after the start ON process, the second relay may first be turned off and then the first relay may be turned off in a start OFF process. In particular, an inverter voltage in a section from a point in time (c) at which the second relay was turned off to a point in time (d) at which the first relay was turned off may be measured, and whether the second relay has been fused may be detected based on whether the inverter voltage has been changed.

Figure 5:
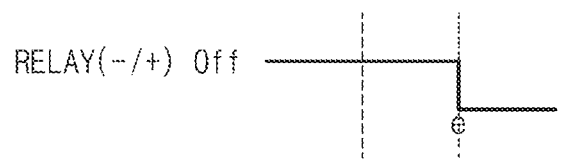
FIG. 5 is a view illustrating a process of turning off a vehicle engine to detect fusion of a relay according to another exemplary embodiment of the present disclosure.

FIG. 5 is a view illustrating a process of turning off a vehicle engine to detect fusion of a relay according to another exemplary embodiment of the present disclosure. Referring to FIG. 5, after the start ON process, both the first and second relays may be simultaneously turned off in a start OFF process. In response to detecting that the first and second relays have not been fused in the start ON process, when the first and second relays are simultaneously turned off in the start OFF process, an inverter voltage at a point in time (e) at which the first and second relays were simultaneously turned off may be decreased to 0V.

As described above, according to exemplary embodiments of the present disclosure, whether a relay has been fused may be more accurately diagnosed by adjusting the relay OFF order when the vehicle engine is turned off, using data regarding whether a relay has been fused may be detected when a vehicle was turned on, and stability of the vehicle may be secured by informing a driver regarding relay fusion through a message or a warning message.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A method for determining fusion of a relay, comprising:
   determining, by a controller, whether at least one or more relays of first and second relays have been fused when a vehicle engine was turned on; and
   adjusting, by the controller, an OFF order of the first and second relays when the vehicle engine is turned off based on the determination of whether the first and second relays have been fused when the vehicle engine was turned on.

2. The method according to claim 1, further comprising:
   in response to determining that the first and second relays have not been fused when the vehicle engine was turned on, simultaneously turning off, by the controller, both the first and second relays when the vehicle engine is turned off.

3. The method according to claim 1, further comprising:
in response to determining that at least one or more relays of the first and second relays have been fused when the vehicle engine was turned on, determining, by the controller, whether the second relay has been fused when the vehicle engine was turned on.

4. The method according to claim 3, further comprising:
when the controller determines that the second relay has been fused when the vehicle engine was turned on, turning off, by the controller, the first relay.

5. The method according to claim 4, further comprising:
determining, by the controller, whether the first relay has been fused when the vehicle engine was turned off, after the turning off of the first relay; and
when the controller determines that the first relay has been fused, determining, by the controller, that both the first relay and the second relay have been fused and outputting a warning to a driver when the vehicle engine was turned off.

6. The method according to claim 5, further comprising:
when the controller determines that the first relay has not been fused in the determination of whether the first relay has been fused when the vehicle engine was turned off, determining, by the controller, that the second relay has been fused, when the vehicle engine was turned off.

7. The method according to claim 3, further comprising:
when the controller determines that the second relay has not been fused in the determination of whether the second relay has been fused when the vehicle engine was turned on, turning off, by the controller, the second relay.

8. The method according to claim 7, further comprising:
determining, by the controller, whether the second relay has been fused when the vehicle engine was turned off, after the turning off of the second relay; and
when the second relay has been fused, diagnosing, by the controller, that both the first relay and the second relay have been fused and outputting a warning to a driver.

9. The method according to claim 8, further comprising:
when the controller determines that the second relay has not been fused when the vehicle engine was turned off in the determination of whether the second relay has been fused when the vehicle engine was turned off, determining, by the controller, that the first relay has been fused.

10. A battery control system, comprising:
a high voltage battery configured to transmit power to a driving motor;
a motor controller including an inverter configured to drive the driving power; and
a power relay assembly configured to execute switching to selectively supply battery power to a vehicle,
wherein a controller is configured to determine whether at least one or more of a first relay and a second relay of the power relay assembly have been fused when a vehicle engine was turned on and adjust an OFF order of the first and second relays when the vehicle engine is turned off based on the determination of whether the first and the second relays have been fused when the vehicle engine was turned on.

11. The battery control system of claim 10, wherein in response to determining that the first and second relays have not been fused when the vehicle engine was turned on, the controller is configured to simultaneously turn off both the first and second relays when the vehicle engine is turned off.

12. The battery control system of claim 10, wherein in response to determining that at least one or more of the first and second relays have been fused when the vehicle engine was turned on, the controller is configured to determine whether the second relay has been fused when the vehicle engine was turned on.

13. The battery control system of claim 12, wherein when the controller determines that the second relay has been fused when the vehicle engine was turned on, the controller is configured to turn off the first relay.

14. The battery control system of claim 13, wherein the controller is further configured to determine, whether the first relay has been fused when the vehicle engine was turned off, after the turning off of the first relay and when the controller determines that the first relay has been fused, determine that both the first relay and the second relay have been fused and output a warning to a driver when the vehicle engine was turned off.

15. The battery control system of claim 14, wherein when the controller determines that the first relay has not been fused in the determination of whether the first relay has been fused when the vehicle engine was turned off, the controller is configured to determine that the second relay has been fused when the vehicle engine was turned off.

16. The battery control system of claim 12, wherein when the controller determines that the second relay has not been fused in the determination of whether the second relay has been fused when the vehicle engine was turned on the controller is configured to turn off the second relay.

17. The battery control system of claim 16, wherein the controller is further configured to determine whether the second relay has been fused when the vehicle engine was turned off, after the turning off of the second relay and when the controller determines that the second relay has been fused when the vehicle engine was turned off, determine that both the first relay and the second relay have been fused and outputting a warning to a driver when the vehicle engine was turned off.

18. The battery control system of claim 17, wherein when controller determines that the second relay has not been fused when the vehicle engine was turned off in the determination of whether the second relay has been fused when the vehicle engine was turned off, the controller is configured to determine that the first relay has been fused.

* * * * *